(12) United States Patent
Lee (10) Patent No.: US 6,607,955 B2
(45) Date of Patent: Aug. 19, 2003

(54) METHOD OF FORMING SELF-ALIGNED CONTACTS IN A SEMICONDUCTOR DEVICE

(75) Inventor: Kyu-Hyun Lee, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 228 days.

(21) Appl. No.: 09/825,346

(22) Filed: Apr. 4, 2001

(65) Prior Publication Data

US 2001/0055867 A1 Dec. 27, 2001

Related U.S. Application Data

(63) Continuation-in-part of application No. 09/350,106, filed on Jul. 9, 1999, now abandoned.

(30) Foreign Application Priority Data

Jul. 13, 1998 (KR) .............................................. 98-28192

(51) Int. Cl.[7] .......................................... H01L 21/8242
(52) U.S. Cl. ...................... 438/256; 438/399; 438/571; 438/586; 438/618; 438/626; 438/637
(58) Field of Search ................................ 438/256, 299, 438/303, 399, 571, 586, 587, 595, 597, 233, 618, 621, 626, 629, 631, 633, 634, 637, 639, 666

(56) References Cited

U.S. PATENT DOCUMENTS

| | | | | |
|---|---|---|---|---|
| 5,907,781 A | * | 5/1999 | Chen et al. | 438/303 |
| 6,084,305 A | | 7/2000 | Harvey | 257/774 |
| 6,103,565 A | * | 8/2000 | Green et al. | 438/238 |
| 6,117,728 A | | 9/2000 | Kauffman et al. | 438/257 |

* cited by examiner

*Primary Examiner*—Olik Chaudhuri
*Assistant Examiner*—Jack Chen
(74) *Attorney, Agent, or Firm*—Lee & Sterba, P.C.

(57) ABSTRACT

A method of forming self-aligned contacts in a semiconductor device wherein a silicon nitride layer and a polysilicon layer are formed on a gate electrode layer. The polysilicon layer, the silicon nitride layer, and the gate electrode layer are etched to form gate electrode configurations. Sidewall spacers are formed on both sidewalls of the gate electrode configurations. An oxide layer is then deposited on the resulting structure. Selected portions of the oxide layer are etched to form self-aligned contacts that expose the semiconductor substrate. Because the polysilicon has an excellent etch selectivity with respect to the oxide layer, the gate electrode layer can be sufficiently protected during the etching of the oxide layer resulting in a good shoulder margin at the exposed upper edges of the silicon nitride gate mask layer.

26 Claims, 7 Drawing Sheets

Fig. 4

METHOD OF FORMING SELF-ALIGNED CONTACTS IN A SEMICONDUCTOR DEVICE

RELATED U.S. APPLICATION DATA

This is a continuation-in-part application of U.S. application Ser. No. 09/350,106, filed Jul. 9, 1999 now abandoned.

BACKGROUND OF THE INVENTION

1. Field of the Invention

The present invention relates generally to semiconductor manufacturing, and more particularly to a method of forming self-aligned contacts in a semiconductor device.

2. Description of the Related Art

The integration of integrated circuit devices continues to increase. As a result, pattern sizes are continuing to get smaller. Further, the wavelength of the light source used in the exposure process is also getting shorter. As an example, wavelengths have decreased from g-line (wave length of 436 nm) and i-line (wave length of 365 nm) to KrF eximer laser (wave length of 248 nm). However, the degree of photolithographic resolution has not kept pace with the degree of integration of integrated circuit devices. One illustration of this occurs in the cell array region of DRAM devices where strict design rules are required and a slight misalignment is not acceptable. Because the degree of photolithographic resolution is not high enough, a self-aligned contact process has been adopted.

However, there are some problems with the self-aligned contact process. Due to the limited photolithographic resolution, it is difficult to form a bit line contact and a storage node contact on the same plan-face through the self-aligned contact process. Desired contact patterns cannot be obtained because the distance between adjacent patterns is too small. The result is that adjacent contacts are undesirably joined together.

To overcome the above mentioned problem, a method has been disclosed which forms an enlarged contact pattern that merges a bit line contact and a storage node contact and uses a photoresist pattern and a gate line as an etching mask. For example, Y. Kohyama et al. disclosed a method of forming self-aligned contacts entitled "A Fully Printable Self-Aligned and Planarized Stacked Capacitor DRAM Cell Technology for 1 GBit DRAM and Beyond."

Figure 1:
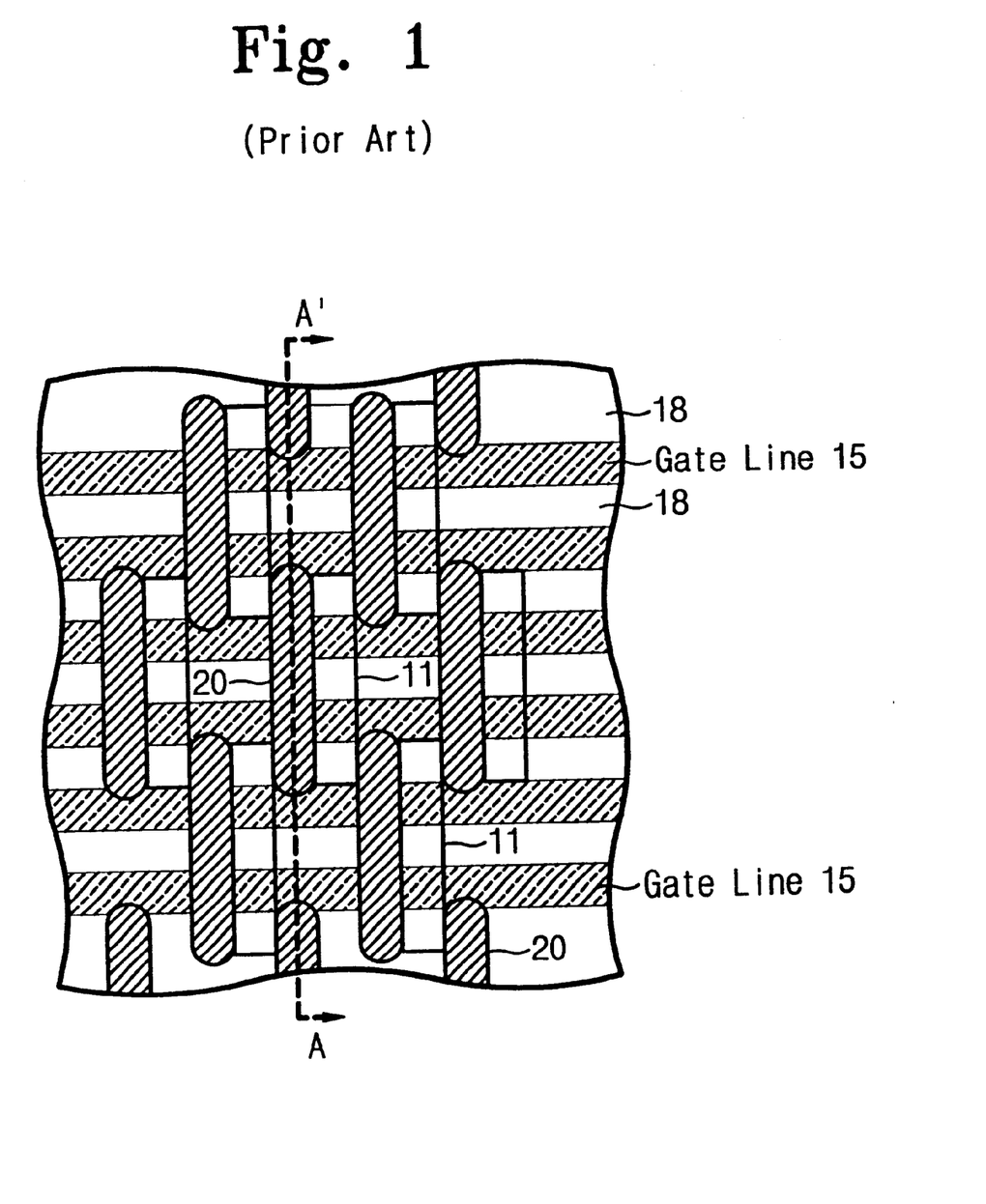
FIG. 1 schematically shows a plan view of a semiconductor substrate.
Figure 2A:
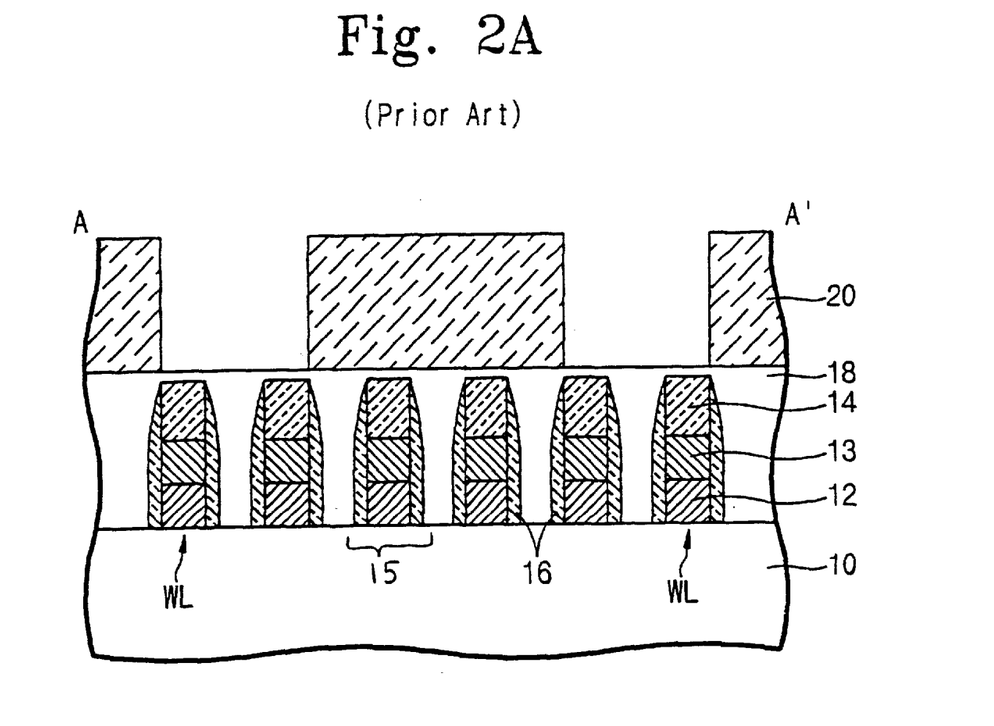
FIGS. 2A–2B are cross-sectional views taken along line A–A' of FIG. 1.
Figure 2B:
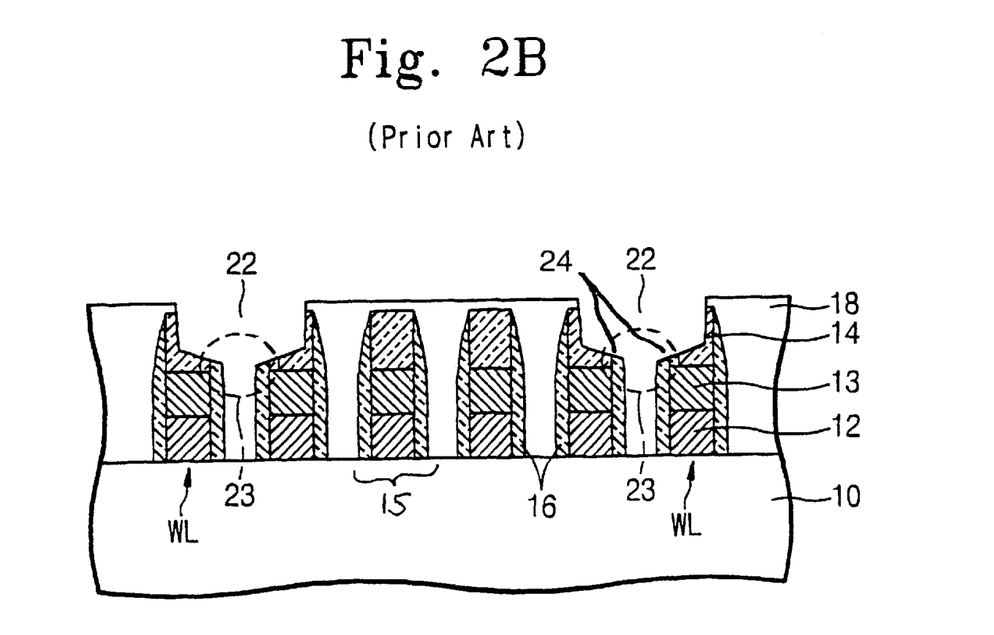

FIG. 1 and FIGS. 2A–2B show schematically a plan view and cross-sectional views, respectively, to explain the self-aligned contacts technology of the above cited reference. Referring to FIG. 1, bar shaped active regions 11 are defined on a semiconductor substrate (not shown). Gate lines 15 intersect the bar shaped active regions 11. Interlayer dielectric layer 18 is composed of an oxide layer and covers the gate lines 15. A self-aligned contact mask 20 (i.e., a photoresist pattern) is formed on the interlayer dielectric layer 18. The self-aligned contact mask 20 has the same basic pattern as the active regions 11, but is shifted by a half pitch to the gate direction. Thus, in FIG. 1 the regions forming the contact mask 20 appear just to the left of the active regions 11.

Referring to FIG. 2A, a device isolation region 10 is formed on a semiconductor substrate (not shown). A plurality of gate lines 15 is formed on the semiconductor substrate including the device isolation region 10. The gate lines 15 are composed of a polysilicon layer 12 and a WSi polycide layer 13 with a SiN hard mask 14 and SiN sidewall spacers 16. Interlayer dielectric layer 18 is deposited on the resulting structure and planarized by a CMP process. The self-aligned contact mask 20 is formed on the interlayer dielectric layer 18.

Referring to FIGS. 2A and 2B, using the self-aligned contact mask 20, the interlayer dielectric layer 18 is etched to form a plurality of self-aligned contact openings 22. If the oxide 18 etching selectivity with respect to silicon nitride hard mask 14 and spacer 16 is poor, then silicon nitride layers 14 and 16 may undesirably be etched resulting a reduced shoulder margin (shortest distance between the gate electrode metal and an adjacent conductive plug subsequently formed in the contact opening 22 adjacent to the gate spacer 16) at the upper edges of the exposed regions of the SiN hard mask 14. It is undesirable if those portions of the SiN mask 14 and the SiN sidewall spacers 16 which cover the upper edges of the gate electrodes 12 and 13 become thin resulting a small shoulder margin (see reference number 23). This leads to a leakage current flow between the conductive plug (filling material), which is subsequently formed in the contact openings 22, and the gate electrode layers 12 and 13. In order to minimize the leakage current between the gate electrode and the contact plug, it is required to prevent thinning of the nitride hard mask (14) and sidewall spacers (16) in the exposed regions during etching of interlayer insulator layer 18.

To overcome this problem, the silicon nitride hard mask 14 can be formed with a greater thickness. Such increased thickness, however, makes it difficult to deposit the subsequent interlayer dielectric layer 18 due to the resulting high aspect ratio of the gate electrode configuration. Voids may then, undesirably, be formed in the interlayer dielectric layer 18 and such voids may occur between adjacent cells.

The present invention is directed to overcoming or at least reducing the effects of one or more of the problems set forth above.

SUMMARY OF THE INVENTION

A feature of an embodiment of the present invention is directed toward providing a method of forming self-aligned contacts which can prevent a silicon nitride layer from being etched during a self-aligned contact etching process.

In one embodiment, in order to protect the silicon nitride hard mask and spacer, a polysilicon layer is deposited thereon. Polysilicon has better etching selectivity, with respect to a later-formed oxide layer, than the silicon nitride layer. Accordingly, the silicon nitride layer is not etched during the self-aligned contact etching. Current leakage between gate electrodes and later-formed self-aligned contact pads is thereby suppressed. Moreover, the polysilicon layer may be formed as a thin layer because of its good etching selectivity with respect to the oxide layer. Therefore, the thickness of the silicon nitride hard mask may be reduced, thereby reducing the height of the gate electrode configuration. To achieve this and other advantages and in accordance with a feature of the present invention, a device isolation region is formed on a semiconductor substrate. A gate oxide layer is formed on the resulting structure to insulate a later-formed gate electrode configuration from the semiconductor substrate. A gate electrode layer, a first gate mask layer, and a second gate mask layer are sequentially stacked on the gate oxide layer. Using a patterned photoresist layer, selected portions of the stacked layers are etched to form a plurality of gate electrode configurations. Sidewall spacers are formed on both sidewalls of each gate electrode configuration.

An insulating layer composed of an oxide layer is deposited to cover the spaced-apart gate electrode configurations. Using a self-aligned mask pattern, selected portions of the insulating layer are etched to form self-aligned contact openings that expose portions of the semiconductor substrate between the gate electrode configurations. During this self-aligned etching, the second mask layer protects the underlying first mask layer. The resulting contact openings are filled with conductive material such as doped polysilicon and planarized to form self-aligned contact pads.

More specifically, in this embodiment the gate electrode layer is made of a stack including a polysilicon layer and a metal silicide layer, such as a tungsten silicide layer, and each layer has a thickness of about 1,000 Å. The first mask layer is made of a silicon nitride layer and has a thickness in a range from about 500 Å to about 1,000 Å. The second mask layer is made of a material that has a better etching selectivity, with respect to an insulating layer (an oxide layer), than the silicon nitride layer, in order to protect the silicon nitride layer. As an example, the second mask layer may be formed of polysilicon. A polysilicon layer is formed as a thin layer due to its good etching selectivity. Accordingly, the silicon nitride layer can be formed as a thin layer, as noted above, as compared with a conventional method wherein a nitride layer is formed to a thickness of at least 1,500 Å. Sidewall spacers are made of a silicon nitride layer and have a thickness of about 500 Å.

Deposition of the oxide insulating layer utilizes an HDP (high density plasma) deposition apparatus. The HDP deposition apparatus has the advantage of depositing a desired layer while also etching it. Accordingly, the resulting oxide layer has good filling characteristics without any void formation therein.

Alternatively, a third mask layer further formed on the second mask layer. The third mask layer may be formed of a HTO (high temperature oxide) layer. This HTO layer has a good etching selectivity with respect to a tungsten silicide layer. In this case, the formation of the gate electrode configurations is as follows. Using the photoresist layer patterned for a gate electrode, the third mask layer, second mask layer, and first mask layer are etched. Using this patterned HTO layer as a mask, the tungsten silicide layer and the polysilicon layer are etched to form the gate electrode configurations.

In order to protect the semiconductor substrate during self-aligned contact etching, a silicon nitride layer may be formed to a thickness of about 100 Å before deposition of the oxide insulating layer.

In accordance with one aspect of the invention, there is provided a method of forming self-aligned contacts in a semiconductor device. The method includes forming a gate oxide layer, a gate electrode layer, a first gate mask, and a second gate mask on a semiconductor substrate. The method further includes etching the second gate mask, the first gate mask, and the gate electrode layer to form gate electrode configurations which are spaced apart. The method further includes forming gate spacers on sidewalls of each of the spaced apart gate electrode configurations and forming an interlayer insulating layer on an entire surface of the semiconductor substrate. The method further includes using a self-aligned contact mask and etching the interlayer insulating layer to expose the semiconductor substrate. The first gate mask, the second gate mask, and the gate spacers each have an etch selectivity with respect to the interlayer insulating layer. The second gate mask has a better etch selectivity, with respect to the interlayer insulating layer, than the first gate mask.

In accordance with another aspect of the invention, there is provided another method of forming self-aligned contacts in a semiconductor device. The method includes forming gate electrode configurations which are spaced apart. Each gate electrode configuration includes a gate electrode layer, a first gate mask, and a second gate mask on a semiconductor substrate. The method further includes forming gate spacers on sidewalls of each of the spaced apart gate electrode configurations and forming an interlayer insulating layer on the gate electrode configurations and the intervening spaces. The first gate mask, the second gate mask, and the gate spacers each have an etch selectivity with respect to the interlayer insulating layer. The second gate mask has a better etch selectivity, with respect to the interlayer insulating layer, than the first gate mask. The method further includes using a self-aligned contact mask and etching the interlayer insulating layer to expose the semiconductor substrate.

In accordance with another aspect of the invention, there is provided yet another method of forming self-aligned contacts in a semiconductor device. The method includes forming a gate oxide layer, a gate electrode layer, a first gate mask, a second gate mask, and a third gate mask on a semiconductor substrate. The third gate mask has etching selectivity with respect to the gate electrode layer. The method further includes etching the third gate mask, the second gate mask, and the first gate mask. The method further includes etching the gate electrode layer, using the third gate mask as an etching mask, thus forming gate electrode configurations which are spaced apart. The method further includes forming gate spacers on sidewalls of each of the spaced apart gate electrode configurations. The third gate mask is removed during the forming of the gate spacers. The method further includes forming a thin material layer to protect the semiconductor substrate, and forming an interlayer insulating layer on an entire surface of the semiconductor substrate. The first gate mask, the second gate mask, and the gate spacers each have an etch selectivity with respect to the interlayer insulating layer. The second gate mask has a better etch selectivity, with respect to the interlayer insulating layer, than the first gate mask. The method further includes using a self-aligned contact mask and etching the interlayer insulating layer to expose the semiconductor substrate. The method further includes removing the self-aligned contact mask, filling the exposed semiconductor substrates with a conductive material, and planarizing the conductive material and the second gate mask and stopping at the first gate mask.

In accordance with another aspect of the invention, there is provided a semiconductor device. The semiconductor device includes a device isolation region, gate electrodes, an interlayer insulating layer, and a self-aligned contact pattern. The gate electrodes are on the device isolation region. Each gate electrode includes a gate electrode layer, a first gate mask layer on the gate electrode layer, a second gate mask layer on the first gate mask layer, and gate spacers on each side of each gate electrode. The gate spacers cover the sides of the gate electrode layer, the first gate mask, and the second gate mask. The interlayer insulating layer is formed on the gate electrodes and in the spaces between the gate electrodes. The first gate mask layer, the second gate mask layer, and the gate spacers each have an etch selectivity with respect to the interlayer insulating layer. The second gate mask layer has a better etch selectivity, with respect to the interlayer insulating layer, than the first gate mask layer. The self-aligned contact pattern is formed on the interlayer insulating layer and at least one of the gate electrodes. The self-aligned contact pattern and the second gate mask layer of one of the gate electrodes can be used as an etching mask to etch the interlayer insulating layer.

In accordance with another aspect of the invention, the exposed upper shoulder regions of the SiN first gate mask layer remained flat even after etching the interlayer dielectric layer when a second gate mask layer, that has a better etch selectivity with respect to the interlayer dielectric layer than the first gate mask layer, is used. On the other hand, etching of the interlayer dielectric layer without using the second gate mask layer on the SiN gate mask layer results in a pyramid shape formation at the exposed upper shoulder regions of the SiN gate mask and the SiN sidewall spacer structure. The improved shoulder margin (shortest distance between the gate electrode metal and an adjacent conductive plug subsequently formed in the contact opening adjacent to the gate spacer) due to the use of the second gate mask layer helps to minimize the leakage current flow between the gate electrode and the conductive plug formed subsequently in the contact opening.

BRIEF DESCRIPTION OF THE DRAWINGS

The above features and advantages of the present invention will become apparent upon reference to the following description of specific embodiments and the attached drawings, wherein.

DETAILED DESCRIPTION OF SPECIFIC EMBODIMENTS

Korean Patent Application No. 98-28192, filed on Jul. 13, 1998, is hereby incorporated by reference as if fully set forth herein.

The present invention will now be described more fully with reference to the accompanying drawings, in which preferred embodiments of the invention are shown. This invention may, however, be embodied in different forms and should not be construed as limited to the embodiments set forth herein. In the drawings, the thickness of layers and regions is exaggerated for clarity. It will also be understood that when a certain layer is referred to as being "on" or "above" a second layer or substrate, the certain layer can be directly on or above the second layer or substrate and one or more intervening layers may also be present. In contrast, when an element is referred to as being "directly on" or "directly above" another element, there are no intervening elements present. Analogous definitions are intended for the words "below" and "under." Moreover, each embodiment described and illustrated herein includes its complementary conductivity type embodiment as well.

Figure 3A:
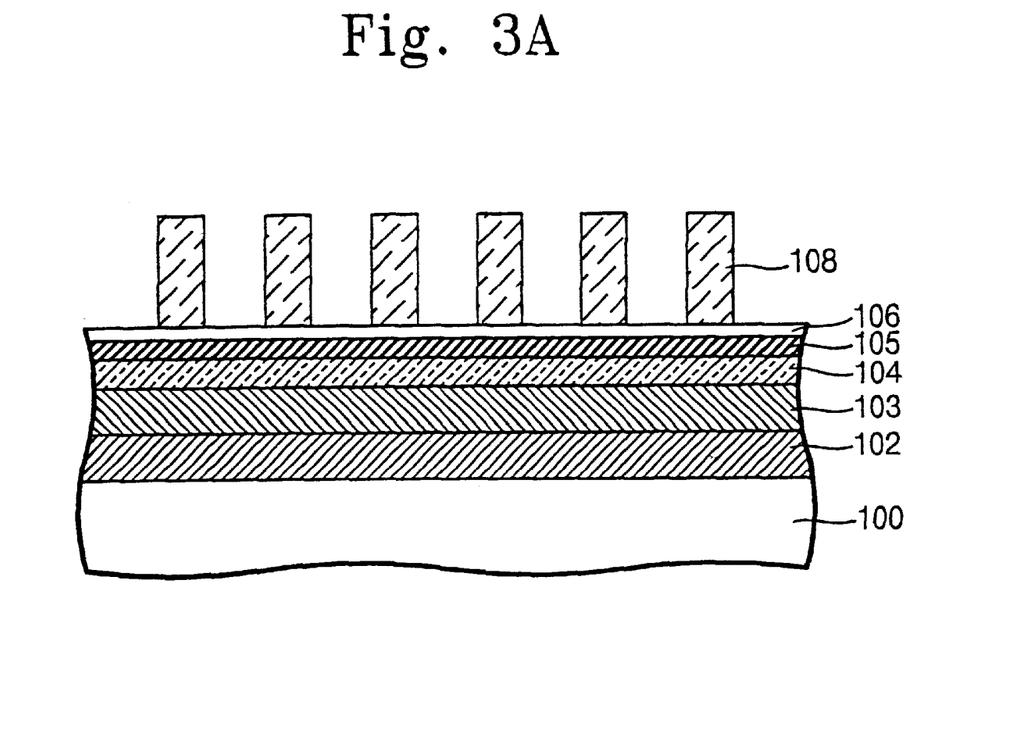
FIGS. 3A–3H are cross-sectional views of a semiconductor topography showing particular steps in forming self-aligned contacts in accordance with the present invention.
Figure 3B:
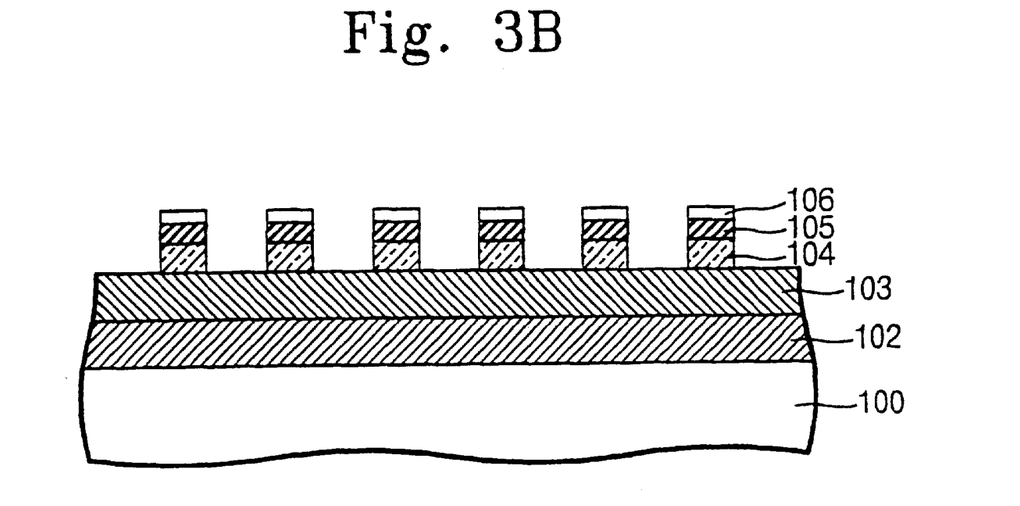

FIGS. 3A–3H are cross-sectional views of a semiconductor topography showing particular process steps in forming self-aligned contacts in accordance with the present invention. FIGS. 3A–3B are cross-sectional views taken along a bit line direction as in FIGS. 2A–2B. Referring now to FIG. 3A, device isolation layer 100 is formed on a predetermined region of a semiconductor substrate (not shown) to define active and inactive regions therein. The device isolation layer 100 is formed by etching the semiconductor substrate to a predetermined depth to form a trench therein, filling the trench with an insulating material, and planarizing the resultant. A conventional LOCal Oxidation of Silicon (LOCOS) technique may also be used. Implantation of impurity ions is performed to form a well region and to adjust the threshold voltage of a transistor.

After forming a gate oxide layer (not shown), gate electrode layers 102 and 103, first gate mask layer 104, second gate mask layer 105, and optional HTO (high temperature oxide) layer 106 are sequentially formed on the gate oxide layer. The gate electrode layers 102 and 103 are made of a polysilicon layer 102 and a metal silicide, such as tungsten silicide, layer 103. As an example, each layer is formed to a thickness of about 1,000 Å. The first gate mask layer 104 is made of a silicon nitride layer that has an etching selectivity with respect to a later-formed interlayer insulating layer. Conventionally, a silicon nitride hard mask is formed to a thickness of at least 1,500 Å. However, in accordance with the present invention, the silicon nitride hard mask 104 is thin compared to the conventional method. This is possible because of the presence of the second hard mask 105 which has a better etching selectivity, with respect to the interlayer insulating layer, than the first hard mask 104. Also, the first gate mask layer 104 serves as an etching stopper during the subsequent planarization process for forming contact pads. Accordingly, the thickness of the first gate mask 104 can be adjusted depending on the uniformity of the subsequent planarization process, for example, in a range from about 500 Å to about 1,000 Å.

The second gate mask layer 105 serves to protect the underlying first gate mask 104 during the self-aligned etching process. As an example, the second gate mask 105 may be made of polysilicon and have a thickness in a range from about 300 Å to about 500 Å. Photoresist pattern 108, which is used to form a storage node, is formed on the HTO layer 106. The HTO layer 106 is provided to obtain sufficient etching selectivity with respect to the tungsten silicide layer 103. As an example, the HTO layer 106 is formed to a thickness in a range from about 300 Å to about 500 Å.

Figure 3C:
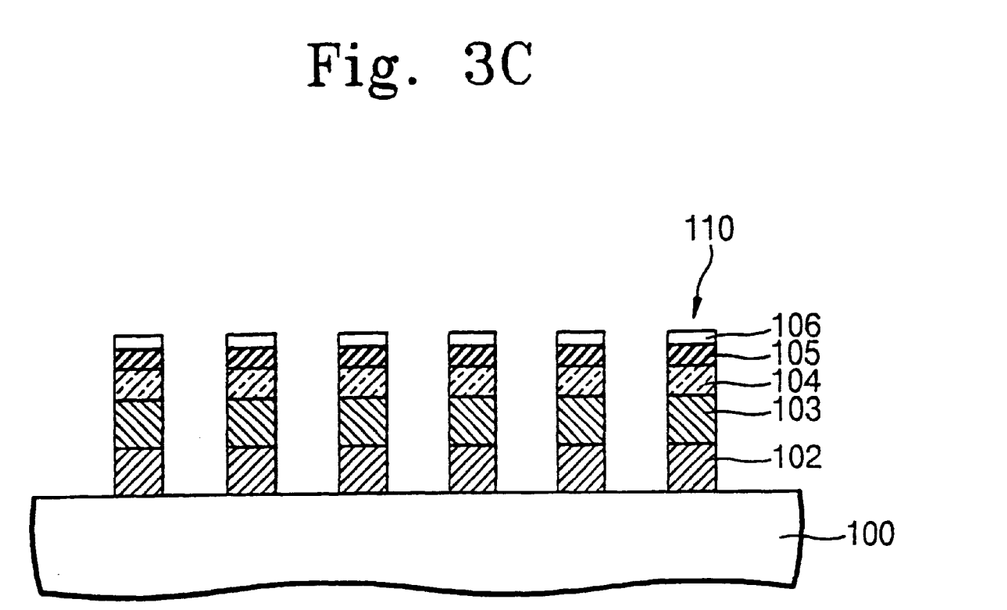
Figure 3D:
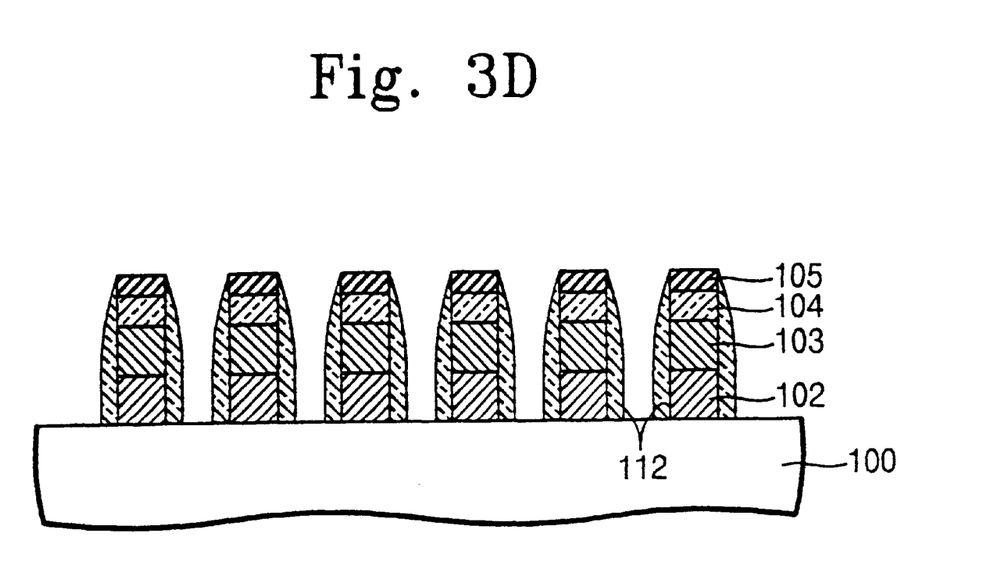

Referring to FIG. 3B, the photoresist pattern 108 is used to etch the HTO layer 106, the second gate mask layer 105, and the first gate mask layer 104. The photoresist pattern 108 is then removed, preferably with a conventional ashing and stripping process. Using the patterned HTO layer 106 and the first and second gate mask layers 104 and 105, the tungsten silicide layer 103 and the polysilicon layer 102 are etched to form a plurality of gate electrode configurations 110 as shown in FIG. 3C. Next, impurity ions are implanted into the semiconductor substrate between gate electrode configurations 110. Referring to FIG. 3D, insulating spacers 112 are formed on both sidewalls of the gate electrode configurations 110. The insulating spacers 112 are made of silicon nitride. The spacers 112 are formed by the process of depositing a silicon nitride layer to a thickness of about 500 Å and then etching back the silicon nitride layer. During this etching back process, the HTO layer 106 is also removed.

In order to protect the semiconductor substrate during self-aligned contact etching, a silicon nitride layer (not shown) may be formed on the resulting structure to a thickness of about 100 Å.

Figure 3E:
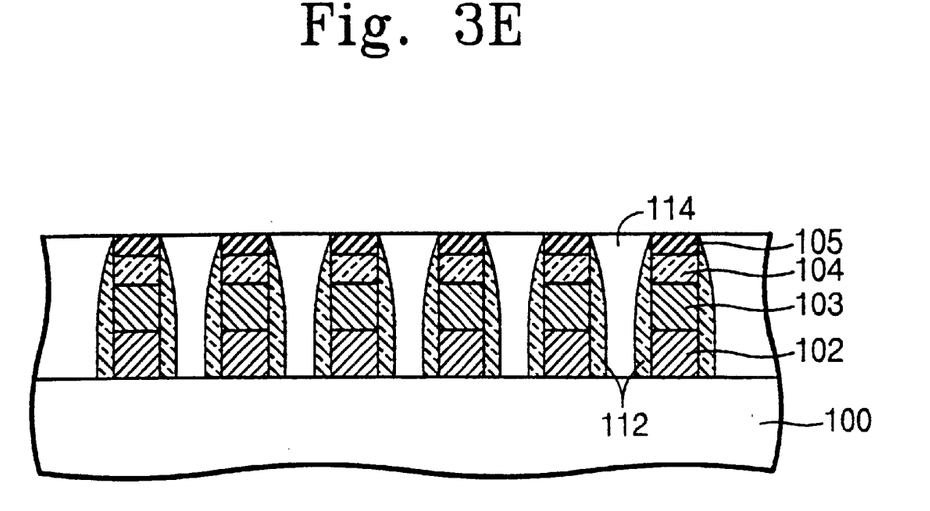

Referring to FIG. 3E, interlayer insulating layer 114 composed of an oxide layer is deposited to fill the spaces between the gate electrode configurations 110. In order to avoid the formation of voids in the interlayer insulating layer 114, an HDP (high density plasma) deposition apparatus is used to deposit the interlayer insulating layer 114. The HDP deposition apparatus has the advantage of depositing the desired layer as well as etching it, and thus obtains a good deposition profile.

Another approach to avoid the formation of voids is to decrease the height of the gate electrode configurations 110. In accordance with the present invention, the first mask layer 104 can be formed as a thin layer due to the presence of the second gate mask layer 105 which has a good etching selectivity with respect to the oxide layer.

Deposited interlayer insulating layer 114 is then planarized by a CMP (chemical mechanical polishing) technique using the second gate mask layer 105 as an end point or stopper. The thickness of the interlayer insulating layer 114 over the gate electrode configurations 110 can be controlled by time-etching.

Figure 3F:
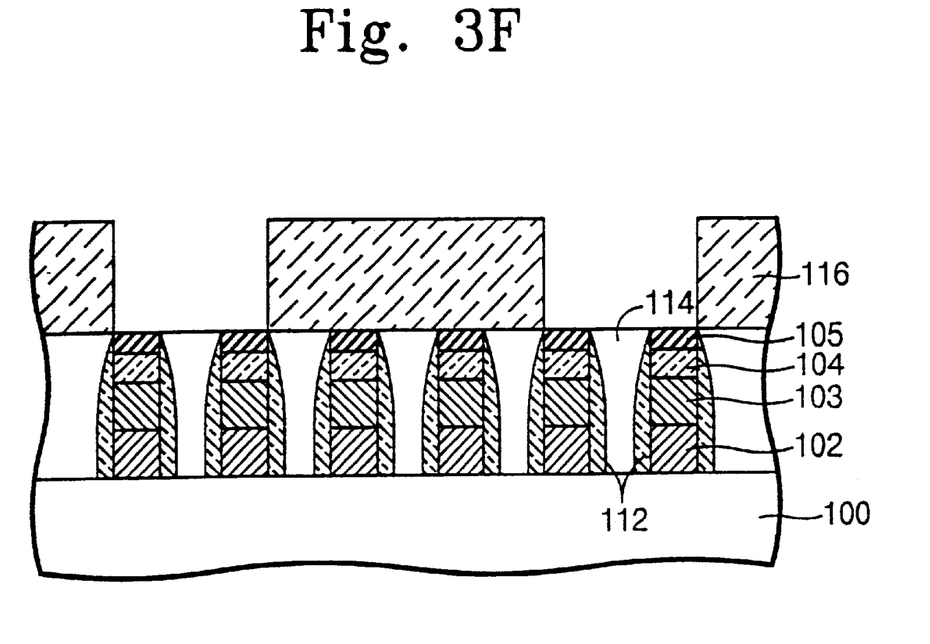
Figure 3G:
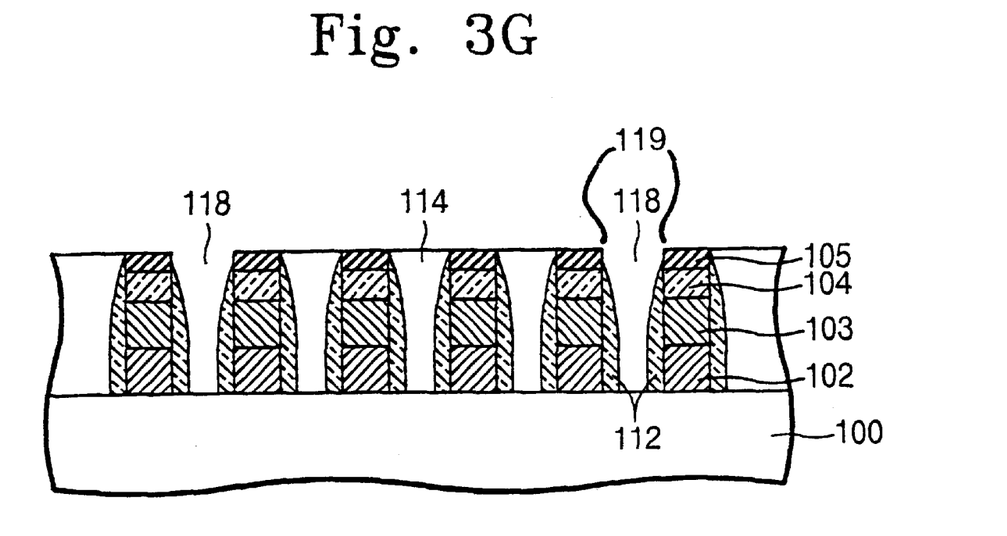

Referring now to FIG. 3F, self-aligned contact pattern 116 is formed on the resulting structure. Using the self-aligned contact pattern 116 and the second gate mask layer 105 as an etching mask, selected portions of the interlayer insulating layer 114 and the protective silicon nitride layer (not shown) are etched to form a plurality of contact holes 118 that expose the semiconductor substrate between the spacers 112 as shown in FIG. 3G. Because the second gate mask layer 105, composed of polysilicon, has a good etching selectivity with respect to the interlayer insulating layer 114 composed of an oxide layer, the first gate mask layer 104 and those portions of the gate spacers 112 which cover the first gate mask layer 104 are not etched.

Figure 4:
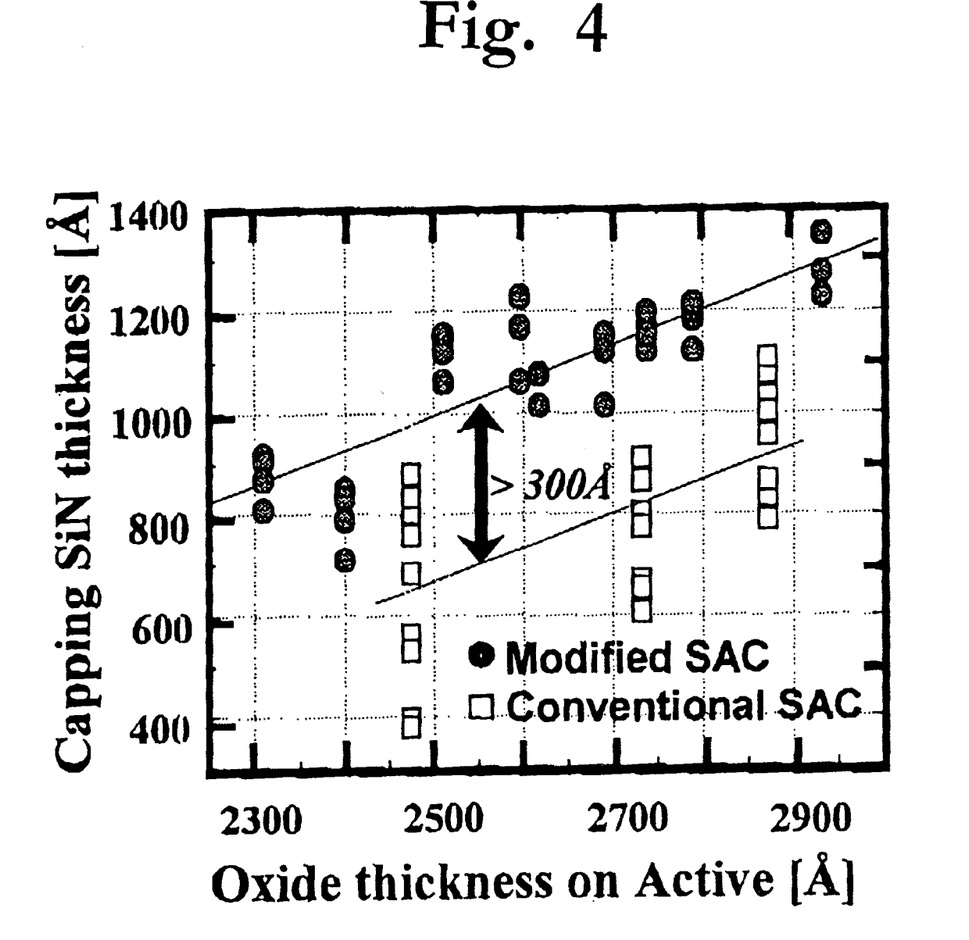
FIG. 4 is a graph showing a thickness of the capping SiN layer versus the thickness of the oxide on the active layer when the second gate mask layer of the present invention is used as compared to when the second gate mask layer of the present invention is not used.

As shown in FIG. 3G, the exposed upper shoulder regions 119 of the SiN first gate mask layer remained flat even after etching the interlayer dielectric layer 114 when a second gate mask layer 105, that has a better etch selectivity with respect to the interlayer dielectric layer 114 than the first gate mask layer 104, is used. On the other hand, as shown in FIG. 2B, etching of the interlayer dielectric layer 18 without the second gate mask layer on the SiN gate mask layer 14 results in a pyramid shape formation at the exposed upper shoulder regions 24 of the SiN gate mask 14 and the SiN sidewall spacer 16 structure. The improved shoulder margin (shortest distance between the gate electrode metal and an adjacent conductive plug subsequently formed in the contact opening 118 adjacent to the gate spacer 112) due to the use of the second gate mask layer helps to minimize the leakage current flow between the gate electrode and the conductive plug formed subsequently in the contact opening 118. As shown in FIG. 4, almost 30 nm higher shoulder margin is achieved with the second gate mask layer compared to not using a second gate mask layer.

Figure 3H:
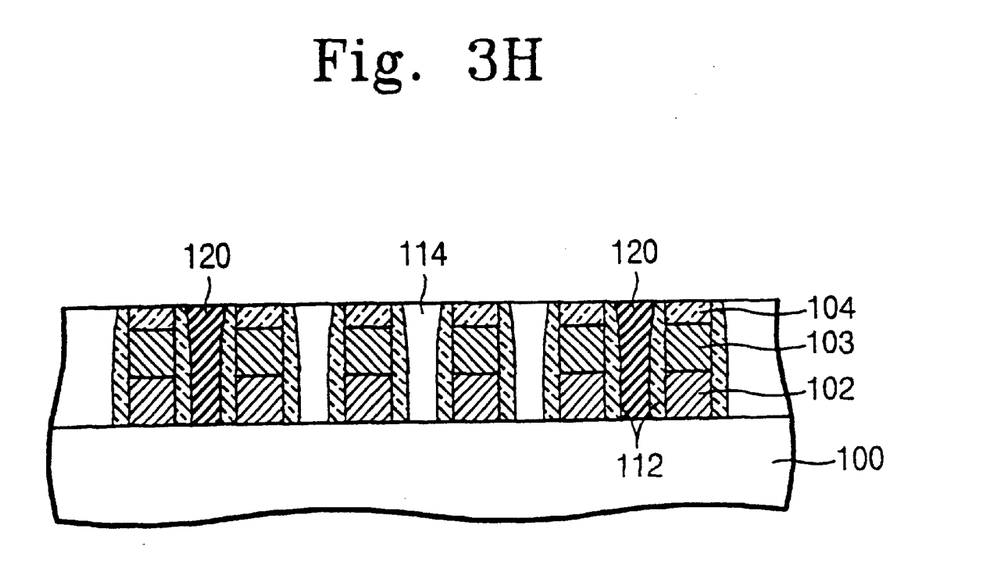

Next, after removing the self-aligned contact pattern 116, conductive material is deposited in the contact holes 118. As an example, doped polysilicon may be deposited to a thickness in a range from about 4,000 Å to about 6,000 Å. Using the first gate mask layer 104 as an etching stopper, the doped polysilicon and second gate mask layer 105 are planarized to form contact pads 120 as shown in FIG. 3H. Planarization may be performed by a CMP technique and uses slurry that has an etching selectivity with respect to silicon nitride. Thus, a method of forming self-aligned contacts in a semiconductor device has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method of forming self-aligned contacts in a semiconductor device, the method comprising:

forming a gate oxide layer, a gate electrode layer, a first gate mask layer, and a second gate mask layer on a semiconductor substrate;

etching the second gate mask layer, the first gate mask layer, and the gate electrode layer to form a plurality of gate electrode configurations which are spaced apart;

forming gate spacers on sidewalls of each of the spaced apart gate electrode configurations;

forming an interlayer insulating layer on an entire surface of the semiconductor substrate;

using a self-aligned contact mask and etching the interlayer insulating layer to expose the semiconductor substrate, removing the self-aligned contact mask; filling the exposed semiconductor substrate with a conductive material; and planarizing the conductive material and the second gate mask layer and stopping at the first gate mask, wherein the first gate mask layer, the second gate mask layer, and the gate spacers each have an etch selectivity with respect to the interlayer insulating layer, and wherein the second gate mask layer has a better etch selectivity, with respect to the interlayer insulating layer, than the first gate mask layer.

2. The method according to claim 1, wherein the first gate mask layer and the gate spacers each comprise a separate silicon nitride layer, the second gate mask layer comprises a polysilicon layer, and the interlayer insulating layer comprises an oxide layer.

3. The method according to claim 2, wherein the interlayer insulating layer comprises an HDP oxide layer.

4. The method according to claim 1, further comprising forming a third gate mask layer on the second gate mask layer, the third gate mask layer having etching selectivity with respect to the gate electrode layer, wherein the third gate mask layer is used as an etching mask for etching the gate electrode layer and the third gate mask layer is removed during the forming of the gate spacers.

5. The method according to claim 4, wherein the second gate mask layer and the gate spacers combine to provide a substantially flat first gate mask layer in the exposed region after etching the interlayer insulating layer.

6. The method according to claim 5, wherein a shoulder margin of the first gate mask layer and the gate spacer is >40 nm.

7. The method according to claim 1, wherein the forming of the interlayer insulating layer is preceded by the forming of a thin material layer to protect the semiconductor substrate.

8. The method according to claim 7, wherein the thin material layer comprises a silicon nitride layer and is formed to a thickness of about 100 Å.

9. The method according to claim 1, further comprising planarizing the interlayer insulating layer by using the second gate mask layer as a stopper.

10. The method according to claim 1, wherein the second gate mask layer and the gate spacers combine to provide a substantially flat first gate mask layer in the exposed region after etching the interlayer insulating layer.

11. The method according to claim 10, wherein a shoulder margin of the first gate mask layer and the gate spacer is >40 nm.

12. A method of forming self-aligned contacts in a semiconductor device, the method comprising:

forming a plurality of gate electrode configurations which are spaced apart, wherein each gate electrode configuration comprises a gate electrode layer, a first gate mask layer, and a second gate mask layer on a semiconductor substrate;

forming gate spacers on sidewalls of each of the spaced apart gate electrode configurations;

forming an interlayer insulating layer on the gate electrode configurations and the intervening spaces, wherein the first gate mask layer, the second gate mask layer, and the gate spacers each have an etch selectivity with respect to the interlayer insulating layer, and wherein the second gate mask layer has a better etch selectivity, with respect to the interlayer insulating layer, than the first gate mask layer;

using a self-aligned contact mask and etching the interlayer insulating layer to removing the self-aligned contact mask; filling the exposed semiconductor substrate with a conductive material; and planarizing the conductive material and the second gate mask layer and stopping at the first gate mask layer, thereby also removing the second gate mask layer during the planarizing of the conductive material, expose the semiconductor substrate.

13. The method according to claim 12, wherein:
the first gate mask layer comprises a silicon nitride layer having a thickness between about 500 Å and 1000 Å;
the gate spacers comprise a separate silicon nitride layer;
the second gate mask layer comprises a polysilicon layer having a thickness between about 300 Å and 500 Å; and
the interlayer insulating layer comprises an oxide layer.

14. The method according to claim 12, wherein the plurality of gate electrode configurations each further comprise a third gate mask layer on the second gate mask layer, wherein the third gate mask layer has an etching selectivity with respect to the gate electrode layer, and wherein the third gate mask layer is used as an etching mask for etching the gate electrode layer.

15. The method according to claim 14, wherein the second gate mask layer and the gate spacers combine to provide a substantially flat first gate mask layer in the exposed region after etching the interlayer insulating layer.

16. The method according to claim 15, wherein a shoulder margin of the first gate mask layer and the gate spacer is >40 nm.

17. The method of claim 14, wherein the third gate mask layer is removed during the forming of the gate spacers.

18. The method according to claim 14, wherein:
the first gate mask layer comprises a silicon nitride layer having a thickness between about 500 Å and 1000 Å;
the second gate mask layer comprises a polysilicon layer having a thickness between about 300 Å and 500 Å;
the gate spacers comprise a separate silicon nitride layer;
the third gate mask layer comprises a high temperature oxide layer having a thickness between about 300 Å and 500 Å; and
the interlayer insulating layer comprises an oxide layer.

19. The method according to claim 12, further comprising planarizing the interlayer insulating layer by using the second gate mask layer as a stopper.

20. The method according to claim 12, wherein the second gate mask layer and the gate spacers combine to provide a substantially flat first gate mask layer in the exposed region after etching the interlayer insulating layer.

21. The method according to claim 20, wherein a shoulder margin of the first gate mask layer and the gate spacer is >40 nm.

22. A method of forming self-aligned contacts in a semiconductor device, the method comprising:

forming a gate oxide layer, a gate electrode layer, a first gate mask layer, a second gate mask layer, and a third gate mask layer on a semiconductor substrate, the third gate mask layer having etching selectivity with respect to the gate electrode layer;

etching the third gate mask layer, the second gate mask layer, and the first gate mask layer;

etching the gate electrode layer, using the third gate mask layer as an etching mask, thus forming a plurality of gate electrode configurations which are spaced apart;

forming gate spacers on sidewalls of each of the spaced apart gate electrode configurations, wherein the third gate mask layer is removed during the forming of the gate spacers;

forming a thin material layer to protect the semiconductor substrate;

forming an interlayer insulating layer on an entire surface of the semiconductor substrate, wherein the first gate mask layer, the second gate mask layer, and the gate spacers each have an etch selectivity with respect to the interlayer insulating layer, and wherein the second gate mask layer has a better etch selectivity, with respect to the interlayer insulating layer, than the first gate mask layer; and using a self-aligned contact mask and etching the interlayer insulating layer to expose the semiconductor substrate;

removing the self-aligned contact mask;

filling the exposed semiconductor substrate with a conductive material; and planarizing the conductive material and the second gate mask layer and stopping at the first gate mask layer.

23. The method according to claim 22, wherein:
the first gate mask layer comprises a silicon nitride layer having a thickness between about 500 Å and 1000 Å;
the gate spacers comprise a separate silicon nitride layer;
the second gate mask layer comprises a polysilicon layer having a thickness between about 300 Å and 500 Å;
the third gate mask layer comprises a high temperature oxide layer having a thickness between about 300 Å and 500 Å;
the thin material layer comprises a silicon nitride layer and is formed to a thickness of about 100 Å; and
the interlayer insulating layer comprises an HDP oxide layer.

24. The method according to claim 22, further comprising planarizing the interlayer insulating layer by using the second gate mask layer as a stopper.

25. The method according to claim 22, wherein the second gate mask layer and the gate spacers combine to provide a substantially flat first gate mask layer in the exposed region after etching the interlayer insulating layer.

26. The method according to claim 25, wherein a shoulder margin of the first gate mask layer and the gate spacer is >40 nm.

* * * * *